(12) United States Patent
Kim

(10) Patent No.: US 6,292,397 B1
(45) Date of Patent: Sep. 18, 2001

(54) NONVOLATILE MEMORY SENSING CIRCUIT AND TECHNIQUES THEREOF

(75) Inventor: Dae-Han Kim, Chungcheongbuk-Do (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/590,071

(22) Filed: Jun. 9, 2000

(30) Foreign Application Priority Data

Jun. 16, 1999 (KR) .................................................. 99-22494

(51) Int. Cl.[7] .................................................. G11C 16/06
(52) U.S. Cl. ........................................ 365/185.2; 365/207
(58) Field of Search ........................... 365/185.2, 185.21, 365/185.29, 185.3, 185.33, 189.09, 203, 207

(56) References Cited

U.S. PATENT DOCUMENTS

| | | | |
|---|---|---|---|
| 5,172,338 | 12/1992 | Mehrotra et al. | 365/185 |
| 5,717,640 | * 2/1998 | Hashimoto | 365/189.07 |
| 5,966,330 | * 10/1999 | Tang et al. | 365/185.2 |
| 6,118,701 | * 9/2000 | Uekubo | 365/185.2 |
| 6,128,227 | * 10/2000 | Kim | 365/185.21 |
| 6,163,484 | * 12/2000 | Uekubo | 365/185.2 |

\* cited by examiner

Primary Examiner—Amir Zarabian
Assistant Examiner—Anh Phung
(74) Attorney, Agent, or Firm—Morgan, Lewis & Bockius LLP

(57) ABSTRACT

The nonvolatile memory sensing circuit includes a main cell part and at least one reference cell part, including a main cell array having a plurality of main cells to which a word line driving signal is applied respectively, a plurality of main cell switches receiving a plurality of main cell selection signals YG0 to YGn which switch to select one of the main cells wherein the main cell switches are connected to the main cell array in series, a main cell bit line voltage controller maintaining drain voltage to a fixed level by receiving program bias voltage PRBIAS, a main cell path transistor connected between an output of the main cell bit line voltage controller and internal power supply voltage wherein the main cell path transistor outputting a state of the main cell, and at least one sense amplifier producing a comparison output SAOUT by receiving at least one reference voltage RDREF and an output SENSE of the main cell path transistor, and wherein the reference cell part further comprises a program reference cell part and read reference cell part which share a voltage controlling means regulating drain or source voltage to a predetermined level and wherein the reference cell part produces reference voltage RDREF of fixed level.

13 Claims, 12 Drawing Sheets

US 6,292,397 B1

NONVOLATILE MEMORY SENSING CIRCUIT AND TECHNIQUES THEREOF

This application claims the benefit of Korean Patent Application No. 99-22494, filed on Jun. 16, 1999, which is hereby incorporated by reference.

BACKGROUND OF THE INVENTION

1. Field of the Invention

The present invention relates to semiconductor memory, more particularly, to nonvolatile memory sensing circuits and techniques thereof which improve the reference structure therein.

2. Background of the Related Art

FIG. 1 shows a nonvolatile memory sensing circuit of two levels according to a related art, and FIG. 2 shows a nonvolatile memory sensing circuit of multi-levels according to a related art.

Referring to FIG. 1, a main cell array 110 including a main cell MC receives word line signals WL and selectively decodes the main cell. A voltage clamp 130 rapidly charges a bit line of the main cell MC and maintains fixed voltage therein. The voltage clamp 130 includes two transistors NM2 and NM3 of which drains are connected to applied voltage VCC and a sense amplifier 150 respectively, and an inverter INV1 which is connected commonly between sources and gates of the transistors NM2 and NM3. The inverter INV1 and NMOS transistor NM2 of which drain is connected to applied voltage VCC form a negative feedback to the other NMOS transistor NM3 connecting the main cell to the sense amplifier 150, controlling drain voltage of another NMOS transistor NM1.

A reference cell controller 120 supplies a gate of a reference cell RFC with drain voltage Vd, control gate voltage Vcg, and erasing gate voltage Veg or erases them. Namely, outputs of an erasing decoder 125 and a program decoder 123 are outputted to a reference cell RFC through a cell erasing or program selection circuit 121. A reference cell array 140 having the reference cell RFC provides the sense amplifier 150 with the criteria judging the data stored in the main cell MC through an NMOS transistor NM4 of which gate receives clock signals.

The sense amplifier 150 which includes an NMOS transistor, PMOS transistors PM1 and PM2, and a latch pan 151 produces the result SA by comparing the levels of the reference cell RFC and main cell MC. Applied voltage VCC is applied to sources of the PMOS transistors PM1 and PM2 having a common gate. A drain and gate of the PMOS transistor PM1 are connected to the reference cell RFC in common while a drain of the other PMOS transistor PM2 is connected to the main cell MC and a stage of an NMOS transistor NM5 of which gate receives a clock signal. The latch part 151 connected to the other stage of the NMOS transistor NM5 outputs the result therefrom. The latch part 151 includes a pair of inverters INV2 and INV3 which form a feed-back structure. The sense amplifier 150, when the main cell MC is on the stage of reading operation, transforms the information of the reference cell RFC into reference voltage with the PMOS transistor PM1, then supplies the gate of the PMOS transistor PM2 with the reference voltage as gate voltage. Then, drain voltage of the PMOS transistor PM2 is transmitted to the latch part 151 through the NMOS transistor NM5 when the clock signal is at "high".

The operation of the nonvolatile memory sensing circuit of two levels of the related art is explained in the following description.

The cell controller 120 is in charge of the programming/erasing of the reference cell RFC in use of drain voltage Vd, control gate voltage Vcg, or erasing gate voltage Veg in accordance with each operational state. In read operation, once the clock signal CLK is enabled, the NMOS transistor NM4 is turned on. Thus, drain voltage of the PMOS transistor PM1 becomes reference voltage of the reference cell PFC since charges are transferred from applied voltage Vcc to the reference cell RFC. The same charges of the reference voltage applied to the gates of the PMOS transistors PM1 and PM2 of the sense amplifier 150 is also flown to the main cell MC because of the mirror phenomenon. In this case, the clock signal CLK is enabled and a read signal READ is applied. The NMOS transistor NM1 is turned on by receiving the word line signal WL to generate charge level of the main cell MC through the voltage clamp 130 to the sense amplifier 150. When the charge flown through the main cell MC is less than the reference charge, the voltage applied to a source of the NMOS transistor NM5 is recognized as 'high level'. When the charge flown through the main cell MC is greater than the reference charge, the voltage applied to the source of the NMOS transistor NM5 is recognized as 'low level'.

A drain voltage of the NMOS transistor NM1 is kept at fixed level by means of the fixed voltage clamp 130. Therefore, there is less chance that the main cell MC is exposed to bit line voltage and the sensitivity of the sense amplifier is increased to prevent the sensing operation being affected by the current variation of the main cell MC when the bit line is influenced by external factors on sensing. The result SA of the voltage level applied to the source of the NMOS transistor NM5 is outputted by the latch part 151.

FIG. 2 shows a nonvolatile memory sensing circuit of multi-levels according to a related art. Referring to FIG. 2, a main cell array 210 including a main cell MC receives word line signals ML and selectively decodes the main cell. A voltage clamp rapidly charges a bit line of the main cell MC and maintains a fixed voltage. A reference cell controller supplies a reference cell array with drain voltage Vd, control gate voltage Vcg, and erasing gate voltage Veg. A cell erasing and program selection circuit receiving an erasing signal Erase and programming signal Program which are decoded by an erasing decoder and programming decoder, which decode the erasing gate voltage Veg in accordance with the erasing or programming operation, supplies a reference cell array 240 with voltage of erasing or programming level. Various levels of a plurality of reference cells Refcell1 to Refcellk in the reference cell array 240 are applied to a sense amplifier 250 by the NMOS transistors N11 to N1$k$ of which gates receive a plurality of clock signals CLK1 to CLKk, respectively.

The sense amplifier 250, which includes PMOS transistors P1 and P2, a plurality of NMOS transistors N21 to N2$k$, and a plurality of latch parts, outputs the results SA1 to SAk by comparing the multi level of the reference cell array 250 to the level of the main cell MC. Applied voltage VCC is connected to sources of the PMOS transistors P1 and P2 which share a gate in common. A drain of the PMOS transistor P1 and the common gate are connected to a reference cell. A drain of the other PMOS transistor is connected to the main cell as well as a plurality of the NMOS transistors N21 to N2$k$ of which gates receive a plurality of clock signals CLK1 to CLKk in parallel.

A plurality of latch parts connected to the other ends of the NMOS transistors N21 to N2$k$, respectively, produce the results SA1 to SAk. Each of the latch parts includes a pair of inverters forming a feed-back structure. The decoder 260 outputs the final values Bit1 to BitL by decoding the results SA1 to SAk produced by the sense amplifier 250. The nonvolatile memory sensing circuit of multi-levels according to the related art shows the same operation as that of the circuit of two levels, except for having the reference cell array 240 consist of a plurality of reference cells Ref Cell1 to Ref Cellk and programming various k number of reference voltages to sense the multi-levels of k+1.

In reading operation, when a plurality of the clock signals CLK1 to CLKk are enabled in order, the sense amplifier 250 supplied with charge levels of a plurality of the reference cells Refcell1 to Refcellk and the main cell MC stores the results in a plurality of the latch parts 241, 243, 245, by comparing the multi-levels of the reference cell array 240 to the level of the main cell MC. After the operations by the clock signals CLK1 to CLKk have been completed successively, the results SA1 to SAk are produced to the decoder 260. Then, the decoder 260 outputs the final values Bit1 to BitL by judging the data of the main cell MC by decoding the results SA1 to SAk outputted by the sense amplifier 250.

Unfortunately, both of the memory sensing circuits of two and multi-levels according to the related art require an additional controller such as program control means and read control means for the main and reference cell programs and for reading the main or reference cell. When the reference cell is programmed in use of a programming means, voltage offset of the programming means occurs. The voltage offset is caused by the variations of fabrication due to temperature, pressure, and the like. Thus, voltage offset of the program controller is inevitable when the reference cell is programmed.

Moreover, the sensing margin is decreased by the influence on the reference cell due to the voltage offset of the reading control means when the reference cell is read by the reading control means, thereby causing the direct fail in the precise reading operation of the memory sensing circuit of multi-levels of which reading margin is basically less than that of two levels.

SUMMARY OF THE INVENTION

Accordingly, the present invention is directed to nonvolatile memory sensing circuits and techniques thereof that substantially obviate one or more problems due to limitations and disadvantages of the related art.

An object of the present invention is to provide nonvolatile memory sensing circuits and techniques thereof which improve the reference structure for securing the sensing margin on reading by canceling out the voltage offset reflected on the main or reference cell.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention of a nonvolatile memory sensing circuit including a main cell part and at least one reference cell part, comprises a main cell array having a plurality of main cells to which word line driving signal is applied respectively, a plurality of main cell switches receiving a plurality of main cell selection signals YG0 to YGn which switch to select one of the main cells, respectively, wherein the main cell switches are connected to the main cell array in series, a main cell bit line voltage controller maintaining drain voltage at a fixed level by receiving program bias voltage PRBIAS, a main cell path transistor connected between an output of the main cell bit line voltage controller and internal power supply voltage, wherein the main cell path transistor outputs a state of the main cell, and at least one sense amplifier producing a comparison output SAOUT by receiving at least one reference voltage RDREF and an output SENSE of the main cell path transistor, wherein the reference cell part further comprises program reference cell part and read reference cell part which sharing a voltage controlling means for regulating drain or source voltage to a predetermined level and producing the reference voltage RDREF of fixed level.

In another aspect, the present invention includes a method of operating a nonvolatile memory sensing circuit comprising the steps of driving a memory sensing means by applying internal power supply voltage VPD and external power supply voltage VDD, programming a program reference cell PFC, generating program reference cell bias voltage PGM-BIAS for programming a read reference cell RFC, programming the read reference cell RFC, generating reference voltage RDREF for programming a main cell MC, programming the main cell MC by using the reference voltage RDREF, and reading data stored in the main cell MC, wherein drain or source voltage of the program reference cell and read reference cell is maintained at a predetermined level by a common means when programming or reading is carried out.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the inventing and together with the description serve to explain the principle of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
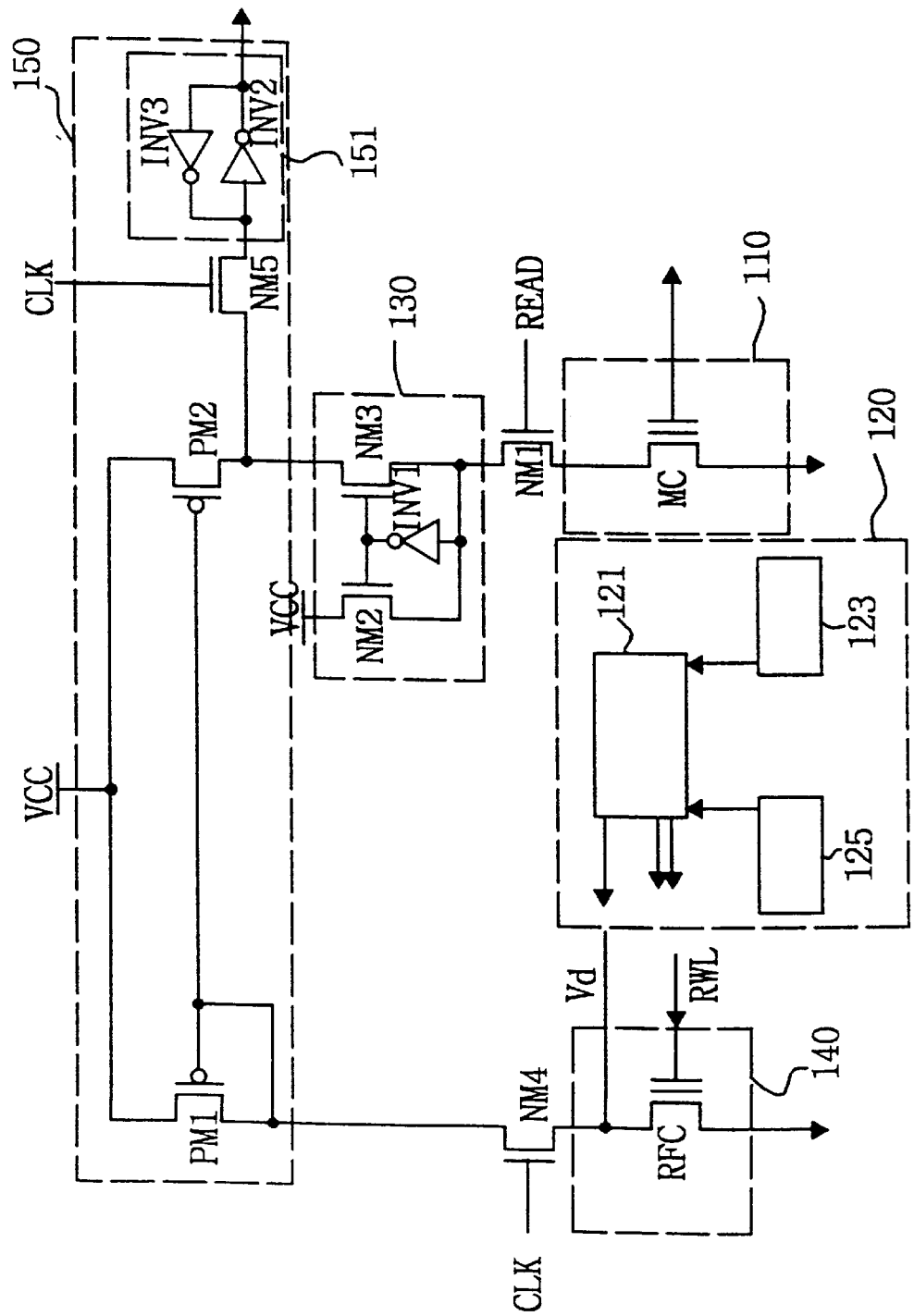
FIG. 1 shows a nonvolatile memory sensing circuit of two levels according to a related art.
Figure 2:
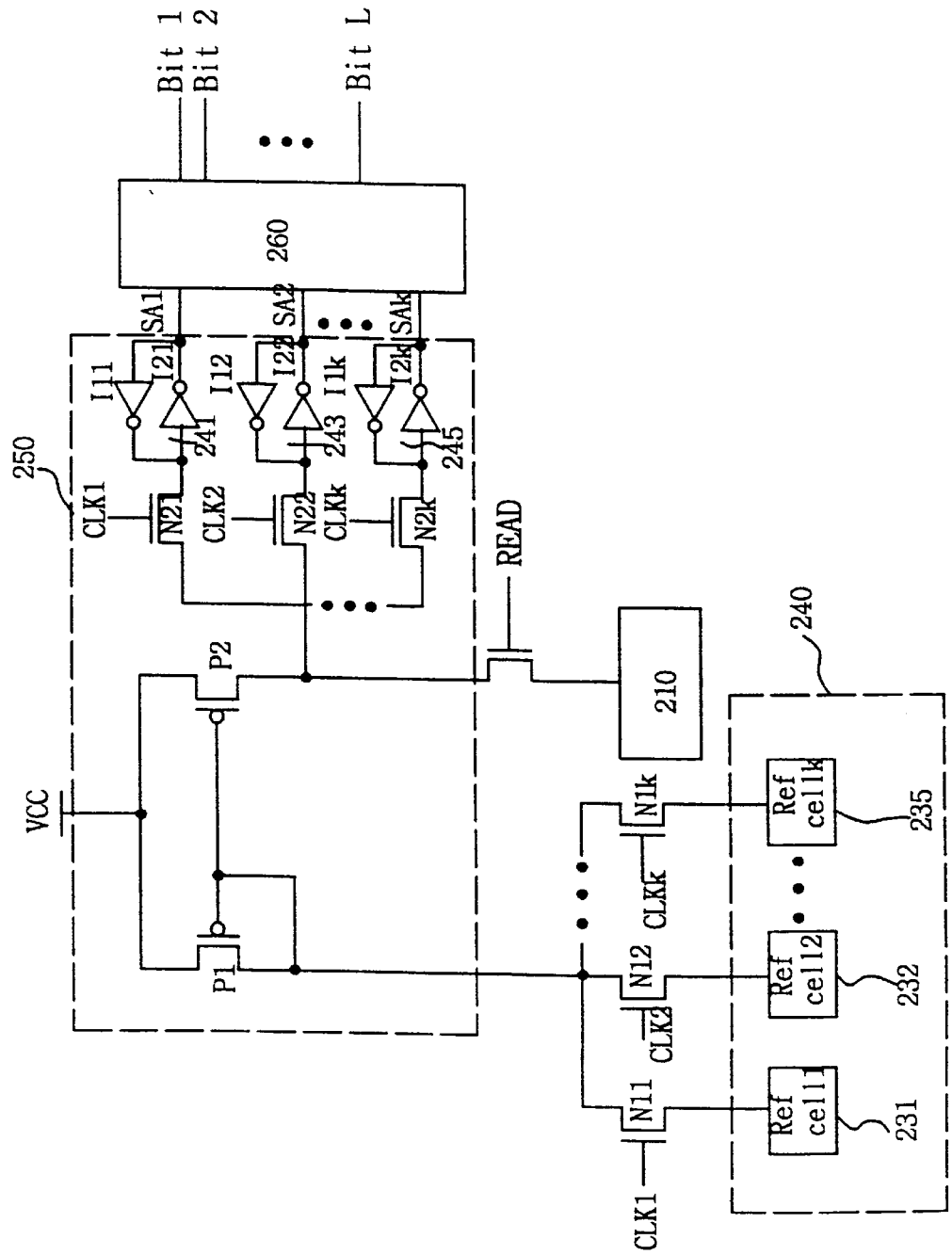
FIG. 2 shows a nonvolatile memory sensing circuit of multi-levels according to a related art.
Figure 3:
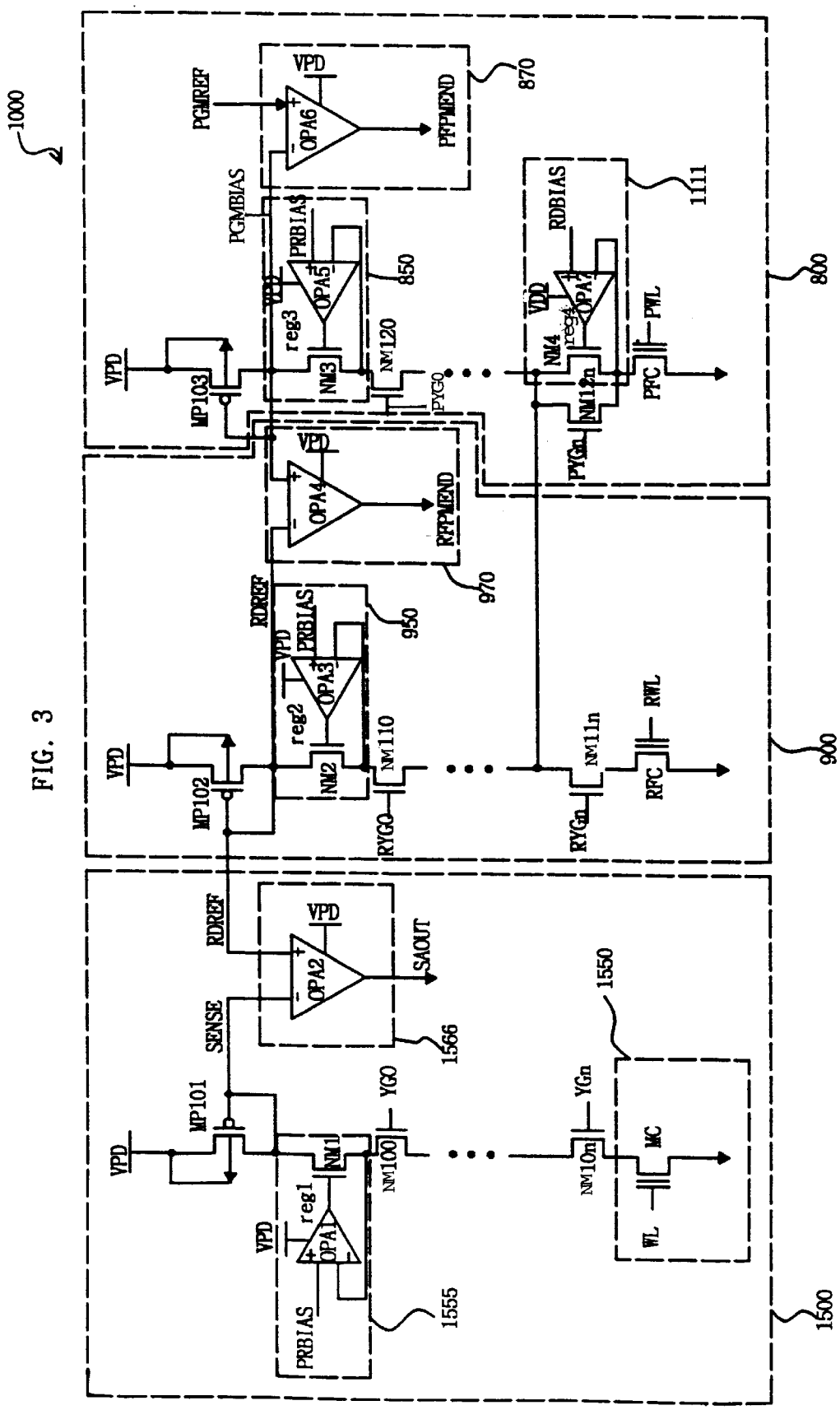
FIG. 3 shows a nonvolatile memory sensing circuit of two levels according to the present invention.

FIG. 3 shows a nonvolatile memory sensing circuit of two levels according to the present invention. Referring to FIG. 3, the nonvolatile memory sensing circuit of two levels according to the present invention is comprised of a main cell part 1500 and a reference cell part 1000. The reference cell part 1000 consists of a program reference cell part 800 and read reference cell part 900 which connected to a common means for controlling drain and source voltage to predetermined level on programming or reading.

The main cell part 1500 is comprised of a main cell array 1550 including a plurality of main cells MC receiving word line driving signals respectively, a plurality of main cell switches NM100 to NM10n receiving a plurality of main cell selection signals YG0 to YGn, respectively, which selects one of the main cells MC and connected to the main cell array 1550, a main cell bit line voltage controller 1555 maintaining drain voltage of the main cell MC by receiving program bias voltage PRBIAS, a main cell path transistor MP101 which is connected between the main cell bit line controller 1555 and internal power supply voltage VPD and which outputs the state of the main cell, and a sense amplifier 1566 which receives an output SENSE and reference voltage RDREF of the main cell path transistor and generates an output by comparing the SENSE and the RDREF.

A program reference cell part 800 includes at least one program reference cell PFC receiving a program reference word line driving signal PWL, a program cell voltage controller 1111 adjusting drain voltage of the program reference cells to the level under external power supply voltage VDD by receiving read bias voltage RDBIAS, a plurality of program cell switches NM120 to NM12n which are connected to an output of the program cell voltage controller 1111 in series and which receive a plurality of program cell gate selection signals PYG0 to PYGn selecting one of the program reference cells PFC, a program cell bit line voltage controller 850 maintaining proper drain voltage when the program reference cell is programmed or read by receiving the program bias voltage PRBIAS, a program reference cell path transistor MP103 which is connected between an output of the program cell bit line voltage controller 850 and internal power supply voltage VPD and generates program reference cell bias voltage PGMBIAS, and a first comparator 870 outputting a program end signal PFPMEND by comparing the program reference cell bias voltage PGMBIAS to the program reference voltage PGMREF.

The read reference cell part 900 is comprised of at least one read reference cell RFC receiving a read word line driving signal RWL, a plurality of read reference cell switches NM110 to NM11n which receive an output of the program cell voltage controller 1111 of the program reference cell part 800 as well as a plurality of read cell gate selection signals RYG0 to RYGn selecting one of the read reference cells RFC and which are connected to the read reference cell RFC in series, a read cell bit line voltage controller 950 maintaining drain voltage at proper fixed level when the read reference cell is programmed or read by receiving program bias voltage PRBIAS, a read reference cell path transistor MP102 which is connected between the read cell bit line voltage controller 950 and internal power supply voltage VPD and generates reference voltage RDREF, and a second comparator 970 outputting a read program end signal RFPMEND by comparing reference voltage RDREF to the output PGMBIAS of the program reference cell path transistor.

The main cell bit line voltage controller 1555 is comprised of a first OP amplifier OPA1 outputting a main cell voltage regulating signal reg1 wherein program bias voltage PRBIAS is inputted to a positive terminal and drain voltage applied through a plurality of main cell switches NM100 to NM10n is inputted to a negative terminal, and an NMOS transistor NM1 of which gate is supplied with the main cell voltage regulating signal reg1 wherein a drain is connected to the main cell switches and a source is connected to the main cell path transistor MP101.

The sense amplifier 1566 consists of a second OP amplifier OPA2 outputting a result SAOUT by receiving internal power supply voltage VPD wherein an output SENSE of the main cell path transistor is inputted to a negative terminal and reference voltage RDREF is inputted to a positive terminal.

The program cell bit line voltage controller 850 is comprised of a fifth OP amplifier OPA5 outputting a program cell voltage regulating signal reg3 by receiving internal power supply voltage wherein program bias voltage PRBIAS is inputted to a positive terminal and drain voltage of the program reference cell applied by a plurality of program cell switches NM120 to NM12n is inputted to a negative terminal and an NMOS transistor NM3 wherein a drain is connected to the NMOS switches, a source is connected to the program reference cell path transistor MP103, and the gate is supplied with the program cell voltage regulating signal reg3.

The read cell bit line voltage controller 950 is comprised of a third OP amplifier OPA3 outputting the read voltage regulating signal reg2 by receiving internal power supply voltage VPD wherein program bias voltage PRBIAS is inputted to a positive terminal and a drain voltage of the read reference cell RFC applied through a plurality of read reference cell switches NM110 to NM11n is inputted to a negative terminal and an NMOS transistor NM2 wherein a drain is connected to the read reference cell switches NM110 to NM11n, a source is connected to the read reference cell path transistor MP102, and a gate is supplied with the program cell voltage regulating signal reg2.

The first comparator 870 consists of a sixth OP amplifier OPA6 outputting the program end signal PFPMEND by receiving internal power supply voltage VPD wherein the program reference cell bias voltage PGMBIAS is inputted to a negative terminal and the program reference voltage PGMREF is inputted to a positive terminal.

The second comparator 970 consists of a fourth OP amplifier OPA4 outputting the read program end signal RFPMEND by receiving internal power supply voltage VPD wherein the program reference cell bias voltage PGMBIAS is inputted to a positive terminal and the reference voltage RDREF is inputted to a negative terminal.

The program cell voltage controller 1111 is comprised of an OP amplifier outputting a voltage regulating signal reg4 by receiving external power supply voltage VDD wherein drain voltage of the program reference cell PFC is inputted to a negative terminal and read bias voltage RDBIAS is inputted to a positive terminal and an NMOS transistor NM4 of which source and drain are shared by those of the program cell switches NM120 to NM12n respectively wherein a voltage regulating signal reg4 is inputted to a gate of the transistor NM4.

The main cell path transistor MP101, program reference cell path transistor MP103, and read reference cell path transistor MP102, of which sources are supplied with internal power supply voltage VPD, consist of PMOS transistors of which sources are supplied with internal power supply voltage VPD and which have common gates and drains.

Figure 4:
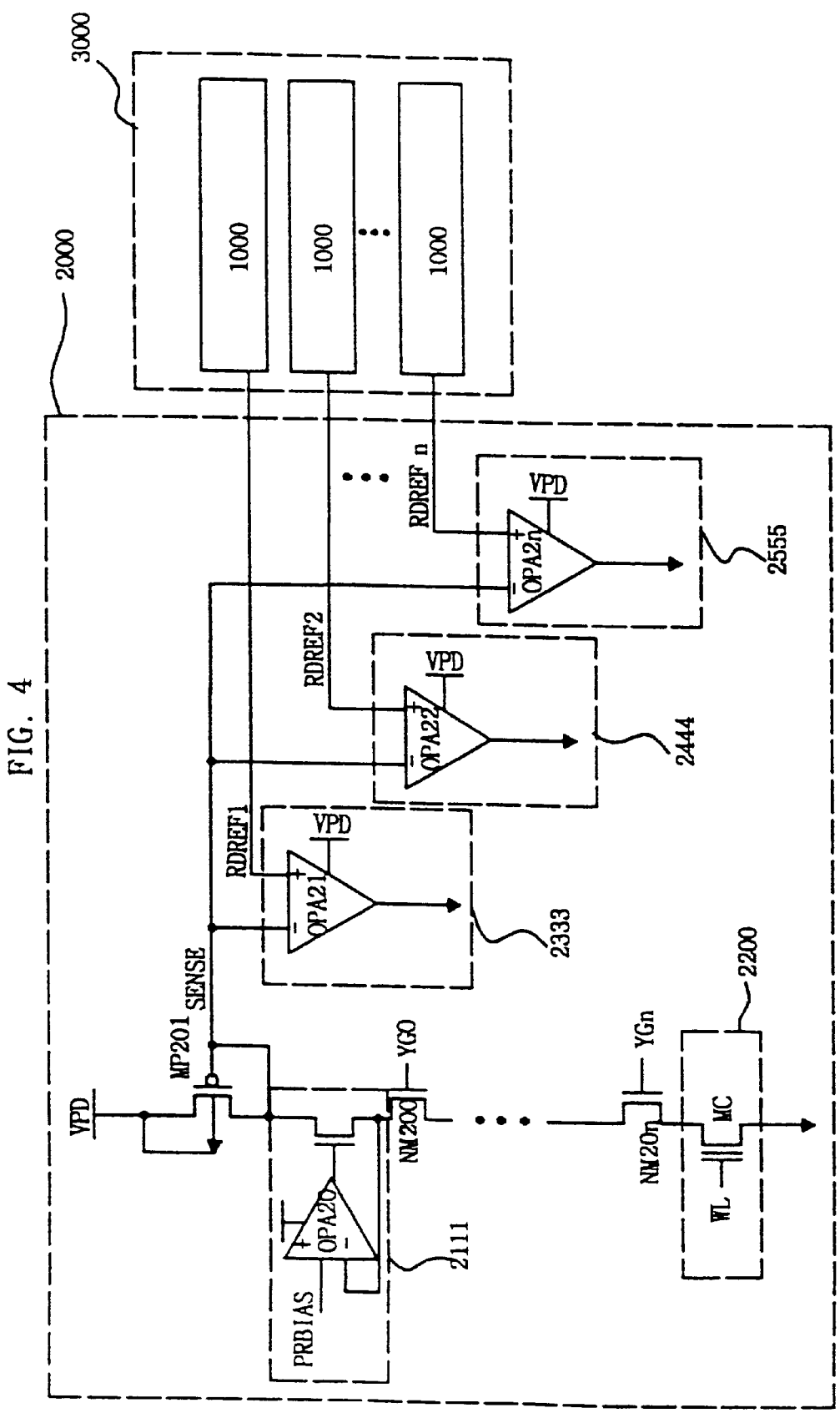
FIG. 4 shows a nonvolatile memory sensing circuit of multi-levels according to the present invention.

FIG. 4 shows a nonvolatile memory sensing circuit of multi-levels according to the present invention. Referring to FIG. 4, the nonvolatile memory sensing circuit of multi-levels of the present invention is comprised of a multi main cell part 2000 and a multi reference cell part 3000. The multi reference cell part 3000 includes a plurality of reference cell parts 1000 which produce different reference voltage RDREF1 to RDREFn, respectively.

The multi main cell part 2000 includes a plurality of multi main cell switches NM200 to NM20n which are connected in series to a plurality of main cells MC receiving a word line driving signal WL, respectively, and are supplied with a plurality of main cell selection signals YG0 to YGn, a multi main cell bit line voltage controller 2111 maintaining drain voltage of the main cell to fixed level by receiving program bias voltage PRBIAS, a main cell path transistor MP201 which is connected between an output of the multi main cell bit line voltage controller 2111 and internal power supply voltage VPD and generate a state of the main cell, and a plurality of sense amplifiers 2333, 3444, and 2555 producing comparison outputs by receiving an output SENSE of the main cell path transistor and a plurality of the reference voltage RDREF1 to RDREFn, respectively.

Figure 5:
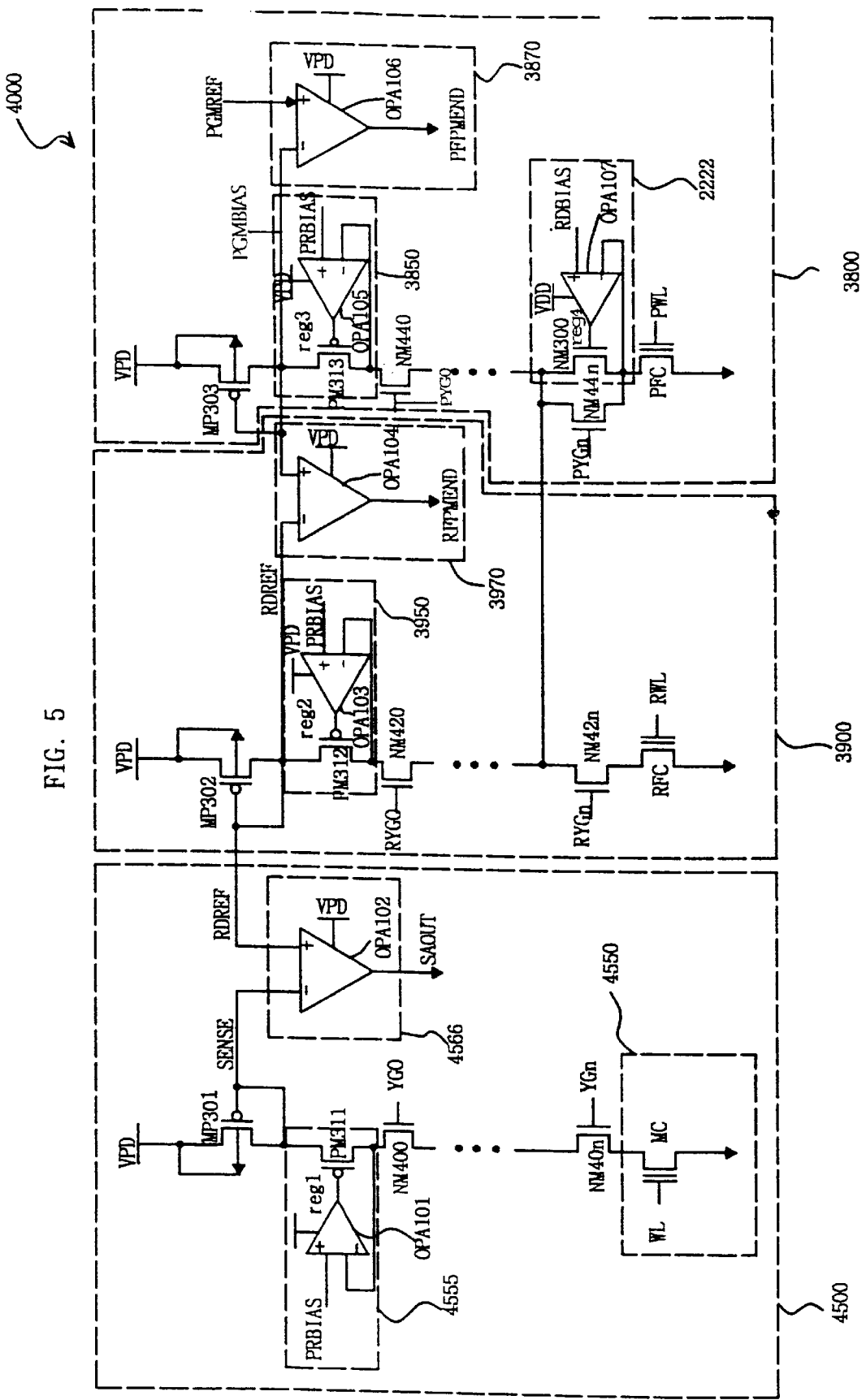
FIG. 5 shows a nonvolatile memory sensing circuit of two levels according to another embodiment of the present invention.

FIG. 5 shows a nonvolatile memory sensing circuit of two levels according to another embodiment of the present invention. Referring to FIG. 5, the nonvolatile memory sensing circuit of two levels of the present invention is comprised of a main cell part 4500 and a reference cell part 4000. The reference cell part 4000 is comprised of a program reference cell part 3800 and read reference cell part 3900 which shares a control means regulating drain or source voltage of a cell on programming or reading.

The main cell part 4500 includes a main cell array 4550 including a plurality of main cells MC receiving a word line driving signal WL, respectively, a plurality of main cell switches NM400 to NM40n which are connected in series to the main cell array 4550 and are supplied with a plurality of main cell selection signals YG0 to YGn selecting one of the main cells, a main cell bit line voltage controller 4555 maintaining drain voltage of the main cell to fixed level by receiving program bias voltage PRBIAS, a main cell path transistor MP301 which is connected between an output of the main cell bit line voltage controller 4555 and internal power supply voltage VPD and generate a state of the main cell, and a sense amplifier 4566 producing comparison outputs by receiving an output SENSE of the main cell path transistor and reference voltage RDREF.

The program reference cell part 3800 includes at least one program reference cell PFC receiving a program reference word line driving signal PWL, a program cell voltage controller 2222 adjusting drain voltage of the program reference cells PFC to the level under external power supply voltage VDD by receiving read bias voltage RDBIAS, a plurality of program cell switches NM440 to NM44n which are connected in series to an output of the program cell voltage controller 2222 and which receive a plurality of program cell gate selection signals PYG0 to PYGn selecting one of the program reference cells PFC, a program cell bit line voltage controller 3850 maintaining proper level of drain voltage when the program reference cell is programmed or read by receiving the program bias voltage PRBIAS, a program reference cell path transistor which is connected between an output of the program cell bit line voltage controller 3850 and internal power supply voltage VPD and generates program reference cell bias voltage PGMBIAS, and a first comparator 3870 outputting a program end signal PFPMEND by comparing the program reference cell bias voltage PGMBIAS to the program reference voltage PGMREF.

The read reference cell part 3900 is comprised of at least one read reference cell RFC receiving a read word line driving signal RWL, a plurality of read reference cell switches NM420 to NM42n which receive an output of the program cell voltage controller 2222 of the program reference cell part 3800 as well as a plurality of read cell gate selection signals RYG0 to RYGn selecting one of the read reference cells RFC and which are connected to the read reference cell RFC in series, a read cell bit line voltage controller 3950 maintaining drain voltage to proper fixed level when the read reference cell is programmed or read by receiving program bias voltage PRBIAS, a read reference cell path transistor which is connected between the read cell bit line voltage controller 3950 and internal power supply voltage VPD and generates reference voltage RDREF, and a second comparator 3970 outputting a read program end signal RFPMEND by comparing reference voltage RDREF to the output PGMBIAS of the program reference cell path transistor.

The main cell bit line voltage controller 4555 is comprised of an 101th OP amplifier OPA101 outputting a main cell voltage regulating signal reg1 wherein program bias voltage PRBIAS is inputted to a positive terminal and drain voltage applied through a plurality of main cell switches NM400 to NM40n is inputted to a negative terminal and a PMOS transistor PM311 of which gate is supplied with the main cell voltage regulating signal reg1 wherein a drain is connected to the main cell switches and a source is connected to the main cell path transistor.

The sense amplifier 4566 consists of an 102th OP amplifier OPA102 outputting a result SAOUT by receiving internal power supply voltage VPD wherein an output SENSE of the main cell path transistor is inputted to a negative terminal and reference voltage RDREF is inputted to a positive terminal.

The program cell bit line voltage controller 3850 is comprised of an 105th OP amplifier OPA105 outputting a program cell voltage regulating signal reg3 by receiving internal power supply voltage wherein program bias voltage PRBIAS is inputted to a positive terminal and drain voltage of the program reference cell applied by a plurality of program cell switches NM440 to NM44n is inputted to a negative terminal and a PMOS transistor PM313 wherein a drain is connected to the drain of the program cell switch NM440, a source is connected to the program reference cell path transistor, and the gate is supplied with the program cell voltage regulating signal reg3.

The read cell bit line voltage controller 3950 is comprised of an 103th OP amplifier OPA103 outputting a read voltage regulating signal reg2 by receiving internal power supply voltage VPD wherein program bias voltage PRBIAS is inputted to a positive terminal and a drain voltage of the read reference cell RFC applied through a plurality of read reference cell switches NM420 to NM42n is inputted to a negative terminal and a PMOS transistor PM312 wherein a drain is connected to the read reference cell switches NM420 to NM42n, a source is connected to the read reference cell path transistor, and a gate is supplied with the program cell voltage regulating signal reg2.

The first comparator 3870 consists of an 106th OP amplifier OPA106 outputting the program end signal PFPMEND by receiving internal power supply voltage VPD wherein the program reference cell bias voltage PGMBIAS is inputted to a negative terminal and the program reference voltage PGMREF is inputted to a positive terminal.

The second comparator 3970 consists of an 104th OP amplifier OPA104 outputting the read program end signal RFPMEND by receiving internal power supply voltage VPD wherein the program reference cell bias voltage PGMBIAS is inputted to a positive terminal and the reference voltage RDREF is inputted to a negative terminal.

The program cell voltage controller 2222 is comprised of an 107th OP amplifier OPA107 outputting a voltage regulating signal reg4 by receiving external power supply voltage VDD wherein drain voltage of the program reference cell PFC is inputted to a negative terminal and read bias voltage RDBIAS is inputted to a positive terminal and an NMOS transistor NM300 of which source and drain are shared by those of the program cell switches NM440 to NM44n respectively wherein the voltage regulating signal reg4 is inputted to a gate of the transistor NM300.

The main cell path transistor, program reference cell path transistor, and read reference cell path transistor, of which sources are supplied with internal power supply voltage VPD, consist of PMOS transistors of which sources are supplied with internal power supply voltage VPD and which have common gates and drains.

A sensing method of nonvolatile memory in use of the nonvolatile memory sensing circuit of the present invention in FIG. 3 will be explained in the following description.

Figure 6:
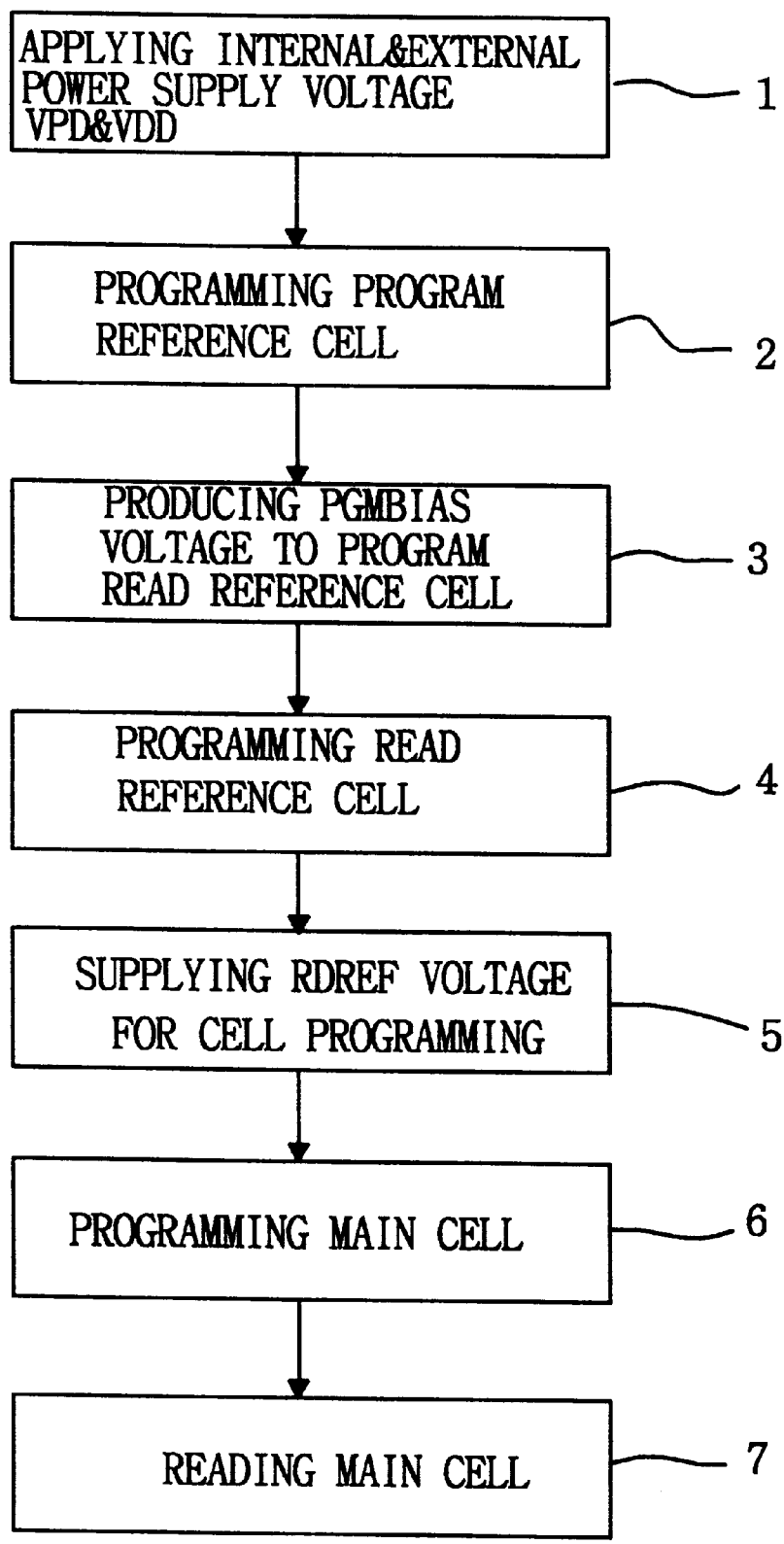
FIG. 6 shows a flow chart of operation of the nonvolatile sensing memory circuit of two levels according to another embodiment of the present invention.

FIG. 6 shows a flow chart of operation of the nonvolatile sensing memory circuit of two levels according to the present invention. The steps of the operation of the nonvolatile memory sensing circuit according to the present invention are as follows:

step 1, a memory sensing circuit is driven by applying internal and external power supply voltages VPD and VDD;

step 2, a program reference cell PFC is programmed;

step 3, program reference cell bias voltage PGMBIAS is produced to program a read reference cell RFC;

step 4, the read reference cell RFC is programmed;

step 5, reference voltage RDREF is produced to program a main cell;

step 6, the main cell is programmed by using the reference voltage RDREF; and step 7, data stored in the main cell is read.

Figure 7:
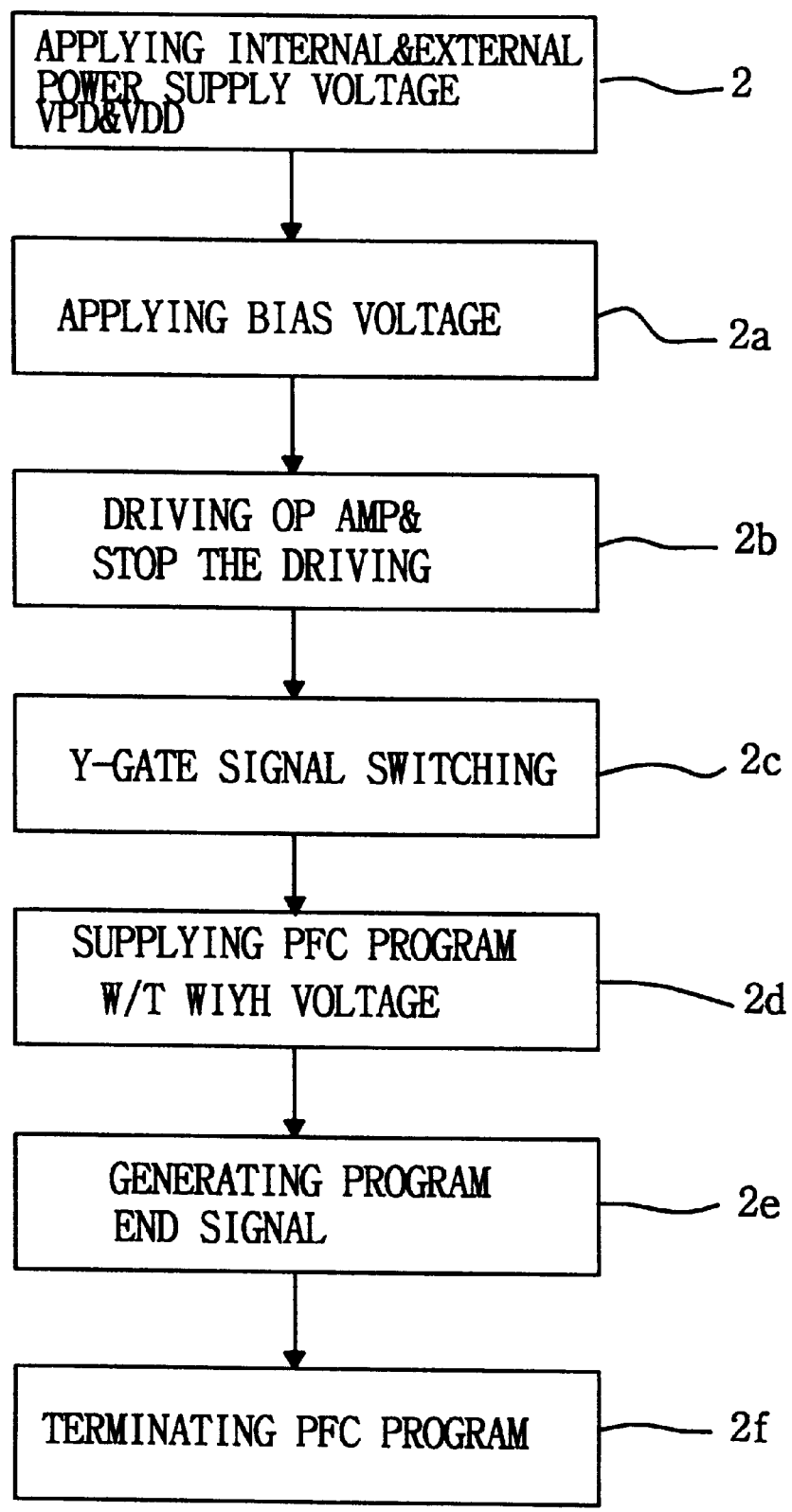
FIG. 7 shows a specific flow chart of the steps of programming a program reference cell in FIG. 6.

FIG. 7 shows a specific flow chart of the steps of programming the program reference cell in FIG. 6. The step 2 in FIG. 6 is explained in detail as follows:

step 2a, internal power supply voltage VPD of which a level is higher than a level of external power supply voltage VDD is applied. The first comparator 870 is supplied with program reference voltage PGMREF, and program bias voltage of 6V is applied to a positive terminal of the program cell bit line voltage controller 850 of the program reference cell PFC;

step 2b, the fifth and sixth OP amplifiers are driven by the applied signal, while the seventh OP amplifier is not driven;

step 2c, a plurality of program cell gate selection signals PYG0 to PYG(n-1) which are selectively applied for the bit line path of at least one program reference cell PFC turns on a plurality of the program cell switches NM120 to NM12(n-1) by selective switching. The program cell gate selection signal PYGn of high level is applied to turn on the program cell switch NM12n and the drain of the program reference cell PFC is supplied with 6V;

step 2d, the program reference cell PFC is programmed as the program reference word line driving signal PWL is applied;

step 2e, as a level of the program reference cell bias voltage PGMBIAS applied to the first comparator 870 becomes higher in the process of the programming the program reference cell PFC, the program end signal PFPMEND of high level is outputted; and step 2f, turning off the NMOS transistor NM3 to cut off internal supply voltage VPD and eliminating charges that have been supplied to the bit line to stop diving the fifth OP amplifier with the program end signal PFPMEND to terminate the programming of the program reference cell PFC and to prevent from being programmed over-level which is unwanted by the program reference cell PFC.

Figure 8:
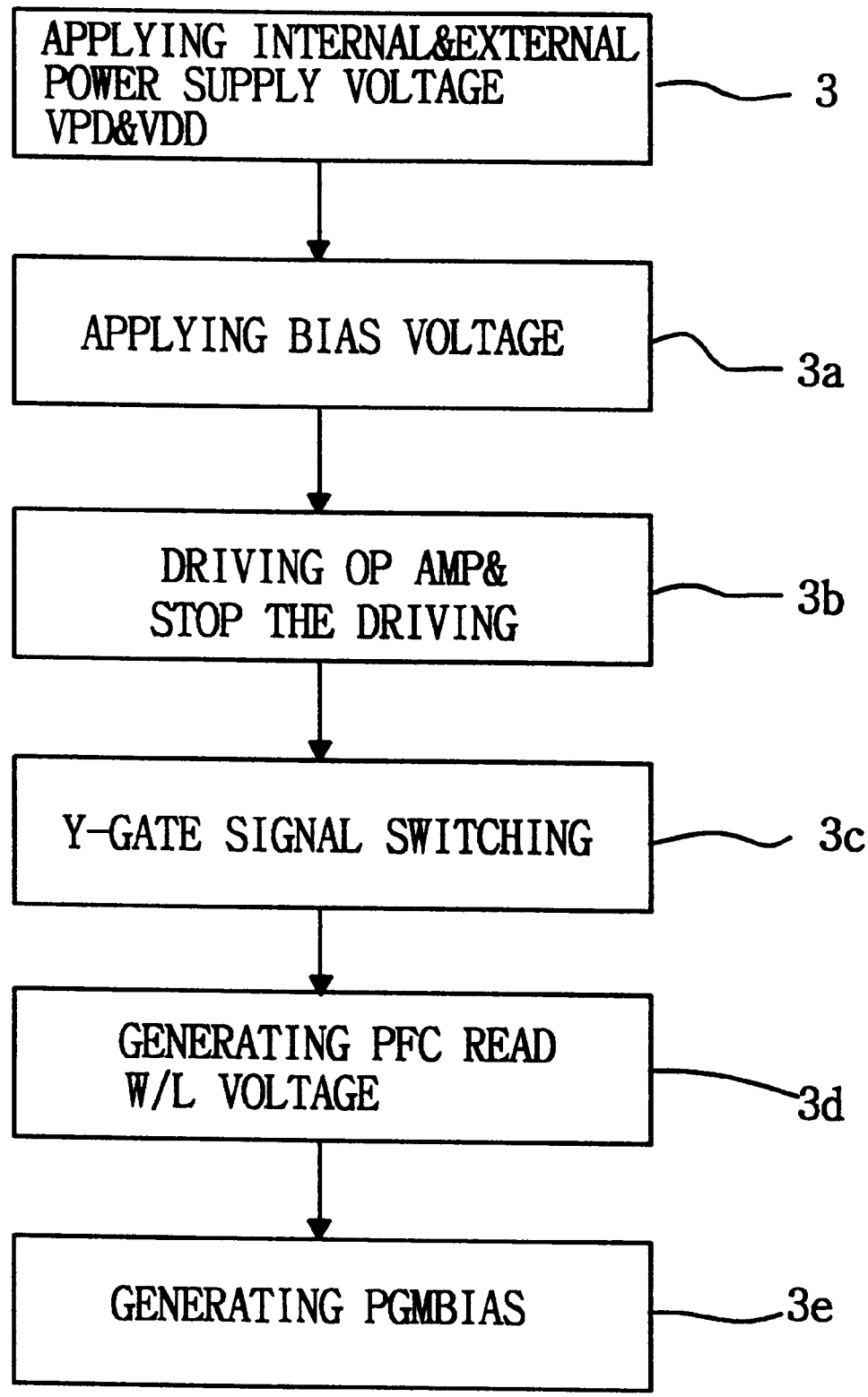
FIG. 8 shows a specific flow chart of the steps of generating program reference cell bias voltage in FIG. 6.

FIG. 8 shows a specific flow chart of the steps of generating program reference cell bias voltage in FIG. 6. The step 3 of generating program reference cell bias voltage PGMBIAS to program a read reference cell RFC further includes the steps of:

step 3a, internal power supply voltage VPD of which level is higher than that of external power supply voltage VDD is applied. The program bias voltage of 6V is applied to the program cell bit line voltage controller 850 of the program reference cell PFC, and read bias voltage of 1.25V is applied to the program cell voltage controller 1111;

step 3b, the fifth and seventh OP amplifiers are driven by the applied signal, while the sixth amplifier is not driven;

step 3c, a plurality of program cell switches NM120 to NM12(n-1) are turned on selectively by supplying a plurality of program cell gate selection signals PYG0 to PYG(n-1), which select the bit line path of the program reference cell PFC, of high level for selective switching. The program cell switch NM12n is turned off by supplying a program cell gate selection signal PYGn of low level;

step 3d, when the program reference word line driving signal PWL is applied, the program reference cell PFC which is not programmed outputs fixed DC current to the drain; and step 3e, DC current outputted from the program reference cell PFC is transformed as program reference cell bias voltage PGMBIAS by the program cell bit line voltage controller 850 of the program reference cell PFC.

Figure 9:
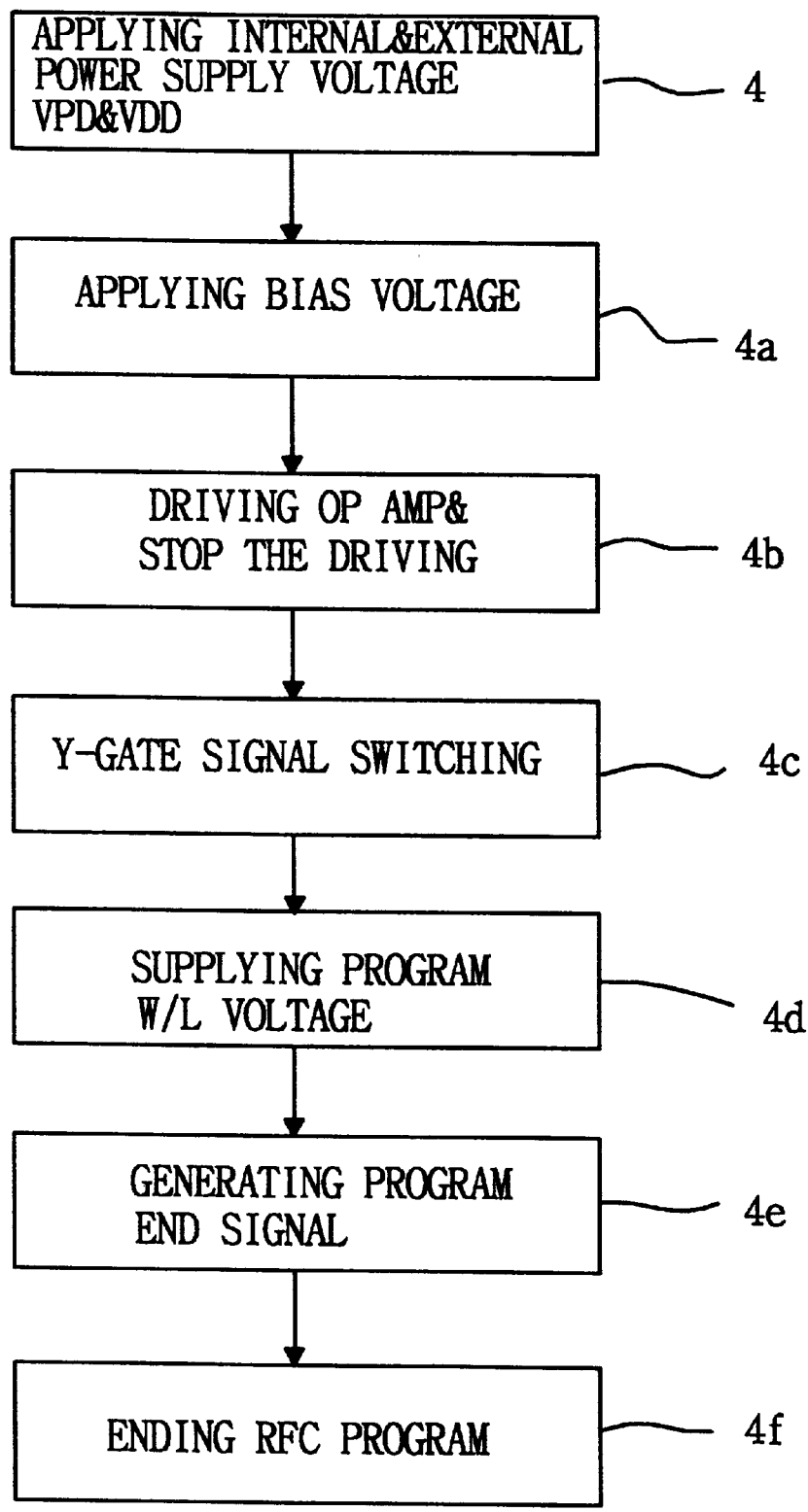
FIG. 9 shows a specific flow chart of the steps of programming a read reference cell in FIG. 6.

FIG. 9 shows a specific flow chart of the steps of programming a read reference cell in FIG. 6. The step 4 of programming the read reference cell RFC is explained in detail as follows:

step 4a, internal power supply voltage VPD of which level is higher than that of external power supply voltage VDD is applied. The program bias voltage PRBIAS of 6V is applied to the bit line path of the read reference cell RFC through a positive terminal of the read cell bit line voltage controller 950, a positive terminal of the comparator 970 is supplied with program reference cell bias voltage PGMBIAS outputted from the step 3, and a negative terminal of the read cell bit line voltage controller 950 of the read reference cell RFC is supplied with a drain voltage of the read reference cell RFC applied through a plurality of read reference cell switches NM110 to NM11*n*;

step 4b, the third and fourth OP amplifiers are driven by the applied signal;

step 4c, a plurality of read cell gate selection signals RYG0 to RYGn of high level, which are selectively applied for the bit line path of at least one read reference cell RFC, turn on a plurality of the read reference cell switches NM110 to NM11*n* by selective switching, then the drain of the read reference cell RFC is supplied with 6V;

step 4d, the read reference cell RFC is programmed by applying a read reference word line driving signal RWL;

step 4e, as a level of bias voltage of the read reference cell RFC applied to the second comparator 970 becomes higher in the process of the programming the read reference cell RFC, the read program end signal RFPMEND of high level is outputted; and step 4f, turning off the NMOS transistor NM2 to cut off internal supply voltage VPD and eliminating charges that have been supplied to the bit line to stop diving the third OP amplifier with the read program end signal RFPMEND to terminate the programming of the read program reference cell RFC and to prevent from being programmed over-level which is unwanted by the read reference cell RFC.

Figure 10:
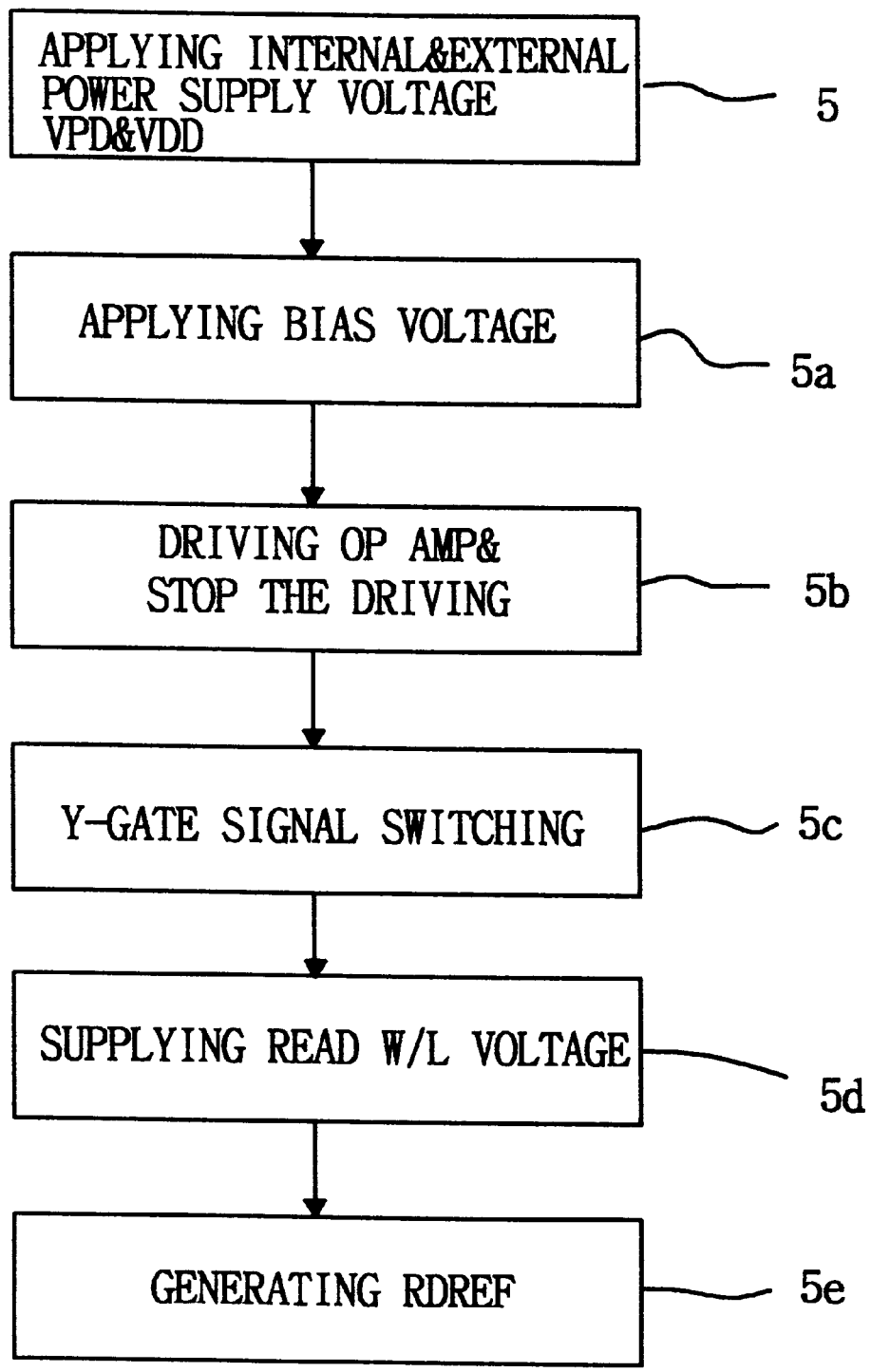
FIG. 10 shows a specific flow chart of the steps of generating reference voltage for a main cell programming in FIG. 6.

FIG. 10 shows a specific flow chart of the steps of generating reference voltage for the main cell programming in FIG. 6. The step 5 of generating reference voltage RDREF for programming the main cell MC is explained in detail as follows:

step 5a, internal power supply voltage VPD of which level is higher than that of external power supply voltage VDD is applied. The program bias voltage of 6V is applied to the read program cell bit line voltage controller 950 of the read reference cell part 900, and read bias voltage RDBIAS of 1.25V is applied to the program cell voltage controller 1111;

step 5b, the third and seventh OP amplifiers are driven by the applied signal, while the fourth, fifth, and sixth OP amplifier is not driven. The NMOS transistors NM2 and NM4 are turned on by the driving of the third and seventh OP amplifiers;

step 5c, a plurality of read reference cell switches NM110 to NM11(n-1) are turned on by selectively supplying a plurality of read cell gate selection signals RYG0 to RYG(n-1), which select the bit line path of the read reference cell RFC, of high level for selective switching. The read reference cell switch NM11*n* is turned off by supplying a read reference cell gate selection signal RYGn of low level, and all the program cell switches of the program reference cell part 800 are turned off;

step 5d, when the program reference word line driving signal PWL is applied, the program reference cell PFC outputs fixed DC current to the bit line path of the read reference cell part 900; and step 5e, DC current outputted from the program reference cell PFC is transformed as reference voltage RDREF by the read cell bit line voltage controller 950 of the read reference cell part 900.

Figure 11:
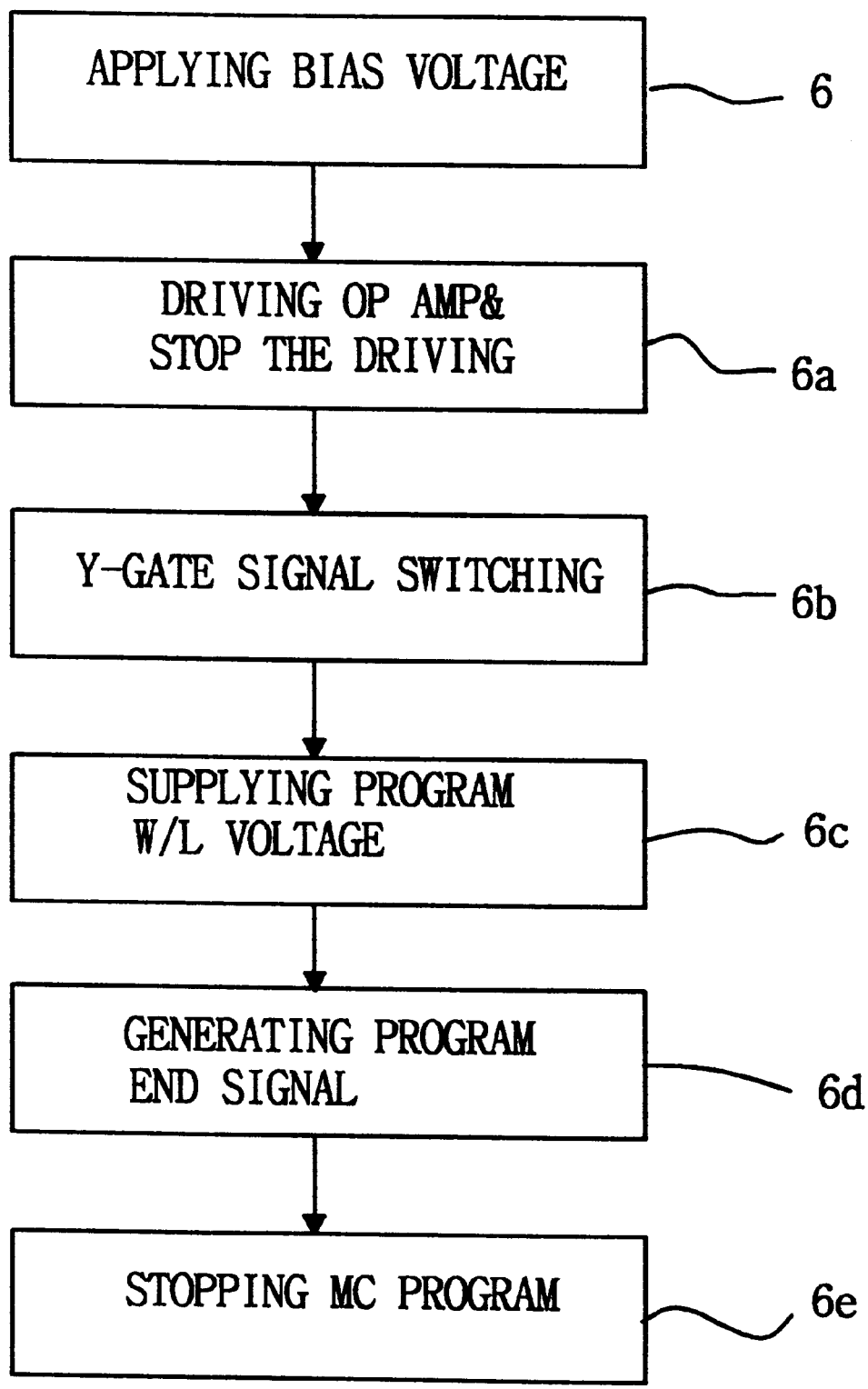
FIG. 11 shows a specific flow chart of the steps of programming the main cell in FIG. 6.

FIG. 11 shows a specific flow chart of the steps of programming the main cell in FIG. 6. The step 6 of programming the main cell MC is explained in detail as follows:

step 6a, internal power supply voltage VPD of which level is higher than that of external power supply voltage VDD is applied. The reference voltage RDREF outputted in the step 5 is applied to the sense amplifier 1566, program bias voltage PRBIAS of 6V is applied to the bit line path of the main cell MC through a positive terminal of the main cell bit line voltage controller 1555, and a positive terminal of the read cell bit line voltage controller 950 is supplied with program bias voltage PRBIAS of 6V;

step 6b, the first and second OP amplifiers are driven by the applied signal;

step 6c, a plurality of main cell gate selection signals YG0 to YGn of high level which are selectively applied for the bit line path of at least one main cell MC turn on a plurality of the main cell switches NM100 to NM10*n* by selective switching, and the drain of the main cell MC is supplied with 6V;

step 6d, the main cell MC is programmed by applying a main cell word line driving signal WL;

step 6e, as a level of the bias voltage of the main cell MC applied to the sense amplifier 1566 becomes higher in the process of programming the main cell MC, the sense amplifier output SAOUT of high level is outputted; and step 6f, turning off the NMOS transistor NM1 to cut off internal supply voltage VPD and eliminating charges that have been supplied to the bit line to stopping driving the first and second OP amplifiers with the sense amplifier output SAOUT to terminate the programming the main cell MC and to prevent from being programmed over-level which is unwanted by the main cell MC.

Figure 12:
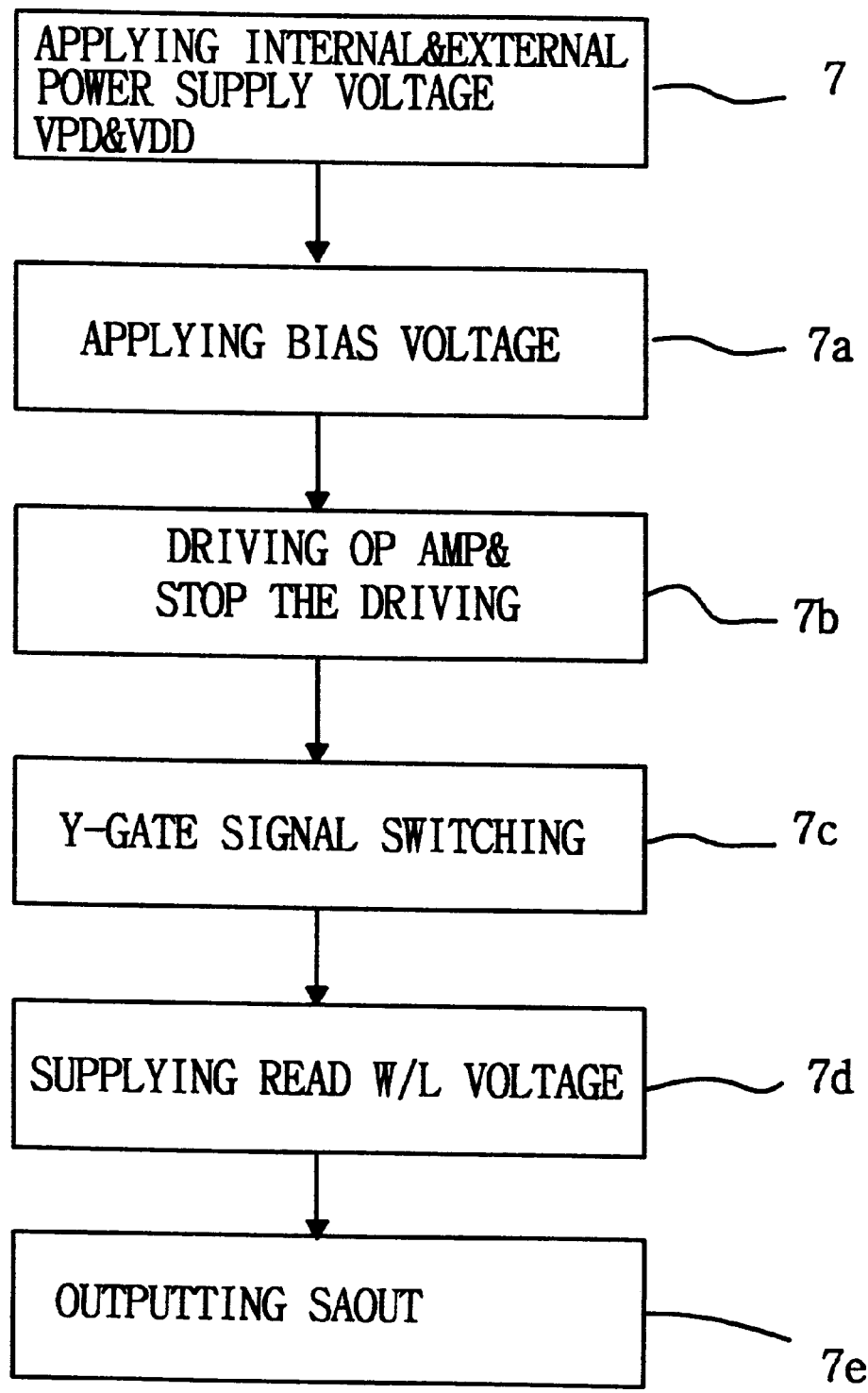
FIG. 12 shows a specific flow chart of the steps of reading the main cell in FIG. 6.

FIG. 12 shows a specific flow chart of the steps of reading the main cell in FIG. 6. The step 7 of reading the data stored in the main cell MC is explained in detail as follows:

step 7a, internal power supply voltage VPD of which level is same as that of external power supply voltage VDD is applied. The main cell bit line voltage controller 1555 and read cell bit line voltage controller 950 are supplied with program bias voltage PRBIAS;

step 7b, the first to third OP amplifiers OPA1, OPA2 and OPA3 are driven by the applied signal, while the fourth OP amplifier OPA4 is not driven;

step 7c, a plurality of main cell switches NM100 to NM10*n* are turned on by selectively supplying a plurality of main cell gate selection signals YG0 to YGn, which select the bit line path of at least one of the main cells MC, of high level for selective switching, and a plurality of read reference cell switches NM110 to NM11*n* are selectively turned on by supplying a plurality of read cell gate selection signals RYG0 to RYGn, which selects the bit line paths of the read reference cell RFC, of high level;

step 7d, the data stored in the main cell MC and read reference cell RFC are outputted by receiving a main cell word line driving signal WL and read reference word line driving signal RWL; and step 7e, once the sense amplifier 1566 is supplied with an output SENSE, which is generated by transforming the current level outputted from the main cell MC into voltage, of the main cell path transistor and the reference voltage RDREF transformed from the current level of the read reference cell RFC by the cell bit line voltage controller 950, the sense amplifier output SAOUT of low level is outputted when the output SENSE of the main cell path transistor is lower than the reference voltage RDREF. And, the sense amplifier output SAOUT becomes high level provided that the output SENSE is higher than the reference voltage RDREF.

The operational process of the nonvolatile memory sensing circuit of multi-levels according to the present invention in FIG. 4 is almost the same in FIG. 6 to FIG. 12 but includes sense amplifier outputs SAOUT1 to SAOUTn of N bits through a plurality of sense amplifiers 2333, 2444, and 2555 which compare the output of the main cell MC with a plurality of reference voltages RDREF1 to RDREFn which are output of a plurality of reference cell part in the multi reference cell part 3000.

The operational process of the nonvolatile memory sensing circuit of two levels according to another embodiment of the present invention in FIG. 5 is almost the same in FIG. 3. However, the embodiment in FIG. 5, comprising the main cell bit line voltage controller 4555, program cell bit line voltage controller 3850, and read cell bit line voltage controller 3950 having PMOS transistors, is able to carry out sensing operation, even if the internal power supply voltage level is decreased.

In the present invention, the layout area of the circuit is reduced, when a reference cell part is being programmed or read, as drain or source voltage of a cell is controlled to a fixed level only by a program cell voltage controller. The voltage drop is prevented by using the same path of programming and reading, sufficient sensing margin is secured by preventing the voltage drop, and sensing capability is increased.

It will be apparent to those skilled in the art that various modifications and variations can be made in nonvolatile memory sensing circuits and techniques thereof of the present invention without departing from the spirit or scope of the inventions. Thus, it is intended that the present invention cover the modifications and variations of this invention provided they come within the scope of the appended claims and equivalents.

What is claimed is:

1. A nonvolatile memory sensing circuit, including a main cell part and at least one reference cell part, comprising:
    a main cell array having a plurality of main cells to each of which a word line driving signal is applied respectively;
    a plurality of main cell switches receiving a plurality of main cell selection signals YG0 to YGn which switch to select one of the main cells, respectively, wherein the main cell switches are connected to the main cell array in series;
    a main cell bit line voltage controller maintaining a drain voltage of the main cell at a fixed level by receiving a program bias voltage PRBIAS, wherein the main cell bit line voltage controller is connected to the plurality of main cell switches;
    a main cell path transistor connected between an output of the main cell bit line voltage controller and an internal power supply voltage, wherein the main cell path transistor outputs a state of the main cell; and
    at least one sense amplifier producing a comparison output SAOUT by receiving at least one reference voltage RDREF and an output SENSE of the main cell path transistor,
    wherein the at least one reference cell part comprises a program reference cell part and a read reference cell part which share a voltage controlling means for regulating drain or source voltages of a program reference cell and a read reference cell to a predetermined level on programming or reading.

2. The nonvolatile memory sensing circuit according to claim 1, wherein the program reference cell part comprises:
    at least one program reference cell receiving a program reference word line driving signal;
    a program cell voltage controller regulating the drain voltage of the program reference cell to a level under an external power supply voltage by receiving a read bias voltage RDBIAS;
    a plurality of program reference cell switches receiving a plurality of program cell gate selection signals PYG0 to PYGn which switch to select one of the program reference cells, respectively, wherein the program reference cell switches are connected to an output of the program cell voltage controller in series;
    a program cell bit line voltage controller maintaining the drain voltage of the program reference cell at proper level when the program reference cell is programmed or read by receiving the program bias voltage PRBIAS;
    a program reference cell path transistor connected between an output of the program cell bit line voltage controller and an internal power supply voltage VPD, wherein the program reference cell path transistor produces a program reference cell bias voltage PGMBIAS; and
    a first comparator outputting a program end signal PFPMEND by comparing the program reference cell bias voltage PGMBIAS with a program reference voltage PGMREF, and the read reference cell part comprises:
    at least one read reference cell receiving a read reference word line driving signal;
    a plurality of read reference cell switches receiving a plurality of read cell gate selection signals RYG0 to RYGn which switch to select one of the read reference cells, respectively, and receiving the output of the program cell voltage controller, wherein the read reference cell switches are connected to the read reference cell in series;
    a read cell bit line voltage controller maintaining a drain voltage of the read reference cell at proper level when the read reference cell is programmed or read by receiving the program bias voltage PRBIAS;
    a read reference cell path transistor connected between an output of the read cell bit line voltage controller and an internal power supply voltage VPD, wherein the read reference cell path transistor produces the reference voltage RDREF; and
    a second comparator outputting a read program end signal RFPMEND by comparing the program reference cell bias voltage PGMBIAS with the reference voltage RDREF.

3. The nonvolatile memory sensing circuit according to claim 2, the program cell bit line voltage controller further comprising:
    an OP amplifier outputting a program cell voltage regulating signal reg3 by receiving an internal power supply voltage, wherein the program bias voltage PRBIAS is applied to a positive terminal and the drain voltage of the program reference cell is applied to a negative terminal through the program reference cell switches; and a NMOS transistor having a drain connected to the program reference cell switch, a source supplied with the program reference cell bias voltage PGMBIAS, and a gate supplied with the program cell voltage regulating signal reg3.

4. The nonvolatile memory sensing circuit according to claim 3, wherein the NMOS transistor of the program cell bit line voltage controller may be replaced with PMOS transistor.

5. The nonvolatile memory sensing circuit according to claim 2, wherein the first comparator includes an OP amplifier outputting the program end signal PFPMEND with the output PGMBIAS of the program reference cell path transistor being applied to a negative terminal and the program reference voltage PGMREF being applied to a positive terminal.

6. The nonvolatile memory sensing circuit according to claim 2, the read cell bit line voltage controller further comprising:

an OP amplifier outputting a read cell voltage regulating signal reg2 by receiving an internal power supply voltage VPD, wherein the program bias voltage PRBIAS is applied to a positive terminal and the drain voltage of the read reference cell is applied to a negative terminal through the read reference cell switches; and a NMOS transistor having a drain connected to the read reference cell switch, a source connected to the read reference cell path transistor, and a gate supplied with the read cell voltage regulating signal reg2.

7. The nonvolatile memory sensing circuit according to claim 6, wherein the NMOS transistor of the read cell bit line voltage controller may be replaced with PMOS transistor.

8. The nonvolatile memory sensing circuit according to claim 2, wherein the second comparator includes an OP amplifier outputting the read end signal RFPMEND with the reference voltage being applied to a negative terminal and the program reference cell bias voltage PGMBIAS being applied to a positive terminal.

9. The nonvolatile memory sensing circuit according to claim 2, the program cell voltage controller further comprising:

an OP amplifier outputting a voltage regulating signal reg4 by receiving an external power supply voltage VDD, wherein the read bias voltage RDBIAS is applied to a positive terminal and the drain voltage of the program reference cell PFC is applied to a negative terminal; and a NMOS transistor having a drain and a source shared by drains and sources of the program cell switches and a gate supplied with the voltage regulating signal reg4.

10. The nonvolatile memory sensing circuit according to claim 2, wherein sources of the main cell path transistor, the program reference cell path transistor, and the read reference cell path transistor, which include PMOS transistors having gates and drains shared in common, are supplied with internal power supply voltages.

11. The nonvolatile memory sensing circuit according to claim 1, the main cell bit line voltage controller further comprising:

an OP amplifier outputting a main cell voltage regulating signal reg1 by receiving an internal power supply voltage VPD, wherein the program bias voltage is applied to a positive terminal and the drain voltage of the main cell supplied through the plurality of main cell switches is applied to a negative terminal; and a NMOS transistor having a drain connected to the main cell switch, a source connected to the main cell path transistor, and a gate receiving the main cell voltage regulating signal reg1.

12. The nonvolatile memory sensing circuit according to claim 11, wherein the NMOS transistor of the main cell bit line voltage controller may be replaced with PMOS transistor.

13. The nonvolatile memory sensing circuit according to claim 1, wherein the sense amplifier includes an OP amplifier with a negative terminal supplied with the output SENSE of the main cell path transistor and a positive terminal supplied with the reference voltage RDREF and outputs the result SAOUT by receiving an internal power supply voltage.

* * * * *